United States Patent [19]

Beasom

[11] Patent Number: 5,373,183
[45] Date of Patent: Dec. 13, 1994

[54] INTEGRATED CIRCUIT WITH IMPROVED REVERSE BIAS BREAKDOWN

[75] Inventor: James D. Beasom, Melbourne Village, Fla.

[73] Assignee: Harris Corporation, Melbourne, Fla.

[21] Appl. No.: 53,244

[22] Filed: Apr. 28, 1993

[51] Int. Cl.⁵ .............................. H01L 29/40
[52] U.S. Cl. ............................ 257/487; 257/488; 257/492; 257/493; 257/520; 257/524
[58] Field of Search ............ 257/488, 492, 493, 520, 257/524, 487, 483, 526, 491, 487

[56] References Cited

U.S. PATENT DOCUMENTS 4,608,590  8/1986  Hartman ........................ 257/134
5,113,236  5/1992  Arnold et al. .................. 257/347
5,241,210  8/1993  Nakagawa et al. ............. 257/487

FOREIGN PATENT DOCUMENTS 0086010  8/1983  European Pat. Off. .
61-89666  5/1986  Japan ............................ 257/488

Primary Examiner—Andrew W. James
Assistant Examiner—John F. Guay
Attorney, Agent, or Firm—Rogers & Killeen

[57] ABSTRACT

A biasing method for and IC with enhanced reverse bias breakdown. A field plate covering the surface PN junction and extending laterally therefrom is biased to partially deplete the island under the field plate and the substrate supporting the island is biased to complete the total depletion of the island under the field plate, establishing a substantially merged vertical field at less than critical for avalanche. Because most of the charge is required to support the vertical component of the field, the rate of change in the horizontal component is small per unit of additional terminal voltage and the lateral extension of the field plate increases the breakdown voltage beyond the plane breakdown for a PN junction of a given doping profile. Vertically isolated conductive material filled trenches laterally abutting the island may be used to decrease the lateral electric field in the corner of the island if the lateral extension of the field plate results in undesirable high field strengths or if proximity to the island edge creates field strength problems with island contacts or interconnect conductors.

48 Claims, 2 Drawing Sheets

INTEGRATED CIRCUIT WITH IMPROVED REVERSE BIAS BREAKDOWN

BACKGROUND OF THE INVENTION

The present invention relates generally to integrated circuits ("ICs") and more specifically to an IC with increased reverse bias breakdown for a given doping profile.

Planar structures with high surface doping are desired for the islands of an IC because of low leakage, ease of manufacture and reproducibility. Where a well of one conductivity type has been created in an island of the other conductivity type to produce a PN junction, the crowding of the field at the PN junction at the surface of the island reduces reverse bias breakdown voltage for a given doping profile.

In ICs having such PN junctions, a depletion layer forms in the island when a reverse bias is applied to the PN junction, which layer has a depth directly (a) proportional to the reverse bias applied to the junction and (b) inversely proportional to ½ to ⅓ power of the doping concentration of the island. At high voltages the doping concentration of the island is small to avoid avalanche breakdown, and the layer of depletion beneath the PN junction may be quite deep under a reverse bias. To prevent the depletion layer from extending downwardly into the supporting substrate, the island must be thick, which results in an undesirable loss of packing density in the IC.

This reduction in island doping concentration also increases the series resistance of the PN junction in the forward direction and limits operating temperature.

It is known to use an appropriately biased field plate overlying at least the surface junction of a planar PN junction to increase the reverse bias breakdown voltage of the junction to thereby deplete the area of the island contiguous to and laterally beyond the surface PN junction. Such field plates mitigate, but do not completely eliminate, the degradation of planar breakdown relative to the breakdown of a plane junction having the same doping profile.

As is shown, e.g., by the Hartman, et al. U.S. Pat. No. 4,608,590, it is also known in gated diode devices to bias the insulated conductive substrate for the island to induce a field in the island and the insulator underlying the island, to thereby deplete the island directly between the PN junction and the substrate (i.e., the JFET channel), and thereby pinch off the conduction of current through the device.

Breakdown occurs in planar PN junctions along the sides of the junction near the island surface or, where there is a field plate, near the island surface around the end of the field plate where the field is crowded. Because breakdown does not generally occur between the PN junction and the bottom of the island, breakdown is not improved by depletion of this area.

Hartman, et al. neither disclose nor teach the use of the combination of field plate and substrate bias to totally deplete the island in the area under the field plate, i.e., an area substantially broader than the depletion area directly under the PN junction and encompassing the area where breakdown usually occurs. Inasmuch as an increase in the width of the field plate increases breakdown where total depletion is obtained, the lateral extension of total depletion may be used to increase breakdown to a value in excess of the plane breakdown of a PN junction with the same doping profile.

It is accordingly an object of the present invention to provide a novel method and PN junction structure with breakdown greater than breakdown that of the same junction and field plate when the substrate is at island voltage.

It is another object of the present invention to provide a novel method and PN junction structure with breakdown greater than breakdown of a plane junction with the same doping profile.

It is still another object of the present invention to provide a novel method and PN junction structure in which the island doping can be increased for a given breakdown, thus increasing the maximum operating temperature.

These and other objects of the present invention are attained by using the combined bias of an insulated field plate and substrate to totally deplete the entire portion of the island under the field plate before the critical field for avalanche is reached. In one aspect, the present invention combines a biasing which merges the depletion layers from a field plate and a biased substrate over an area sufficiently enlarged by enlargement of the field plate to increase breakdown beyond the breakdown for a plane PN junction with the same doping profile.

Where the same or electrically interconnected substrate is used for both vertical and lateral isolation (i.e., at both the bottom and sides of the island), the biasing of the laterally isolating substrate (i.e., at the sides of the island) may present corner breakdown problems in particular island geometries. For example, the potential difference between the biased substrate and either the island contact or a terminal interconnect may add to the field passing through the island adjacent a lateral edge thereof, i.e., the "corner" of the island. This increase in field strength may result in undesirable avalanche at a reduced terminal voltage. A more detailed explanation of corner breakdown may be obtained by reference to my copending application Ser. No. 08/053,343 filed concurrently herewith and assigned to the assignee hereof, the disclosure of said application being herein incorporated by reference.

It is accordingly another object of the present invention to provide a novel IC and method for enhancing breakdown by reducing corner breakdown, and more particularly by the separate biasing of the vertical and lateral island isolating substrates.

Other objects, advantages and novel features of the present invention will become apparent from the claims and from the following detailed description of preferred embodiments of the invention when considered in conjunction with the accompanying drawings.

DESCRIPTION OF PREFERRED EMBODIMENTS

Figure 1:
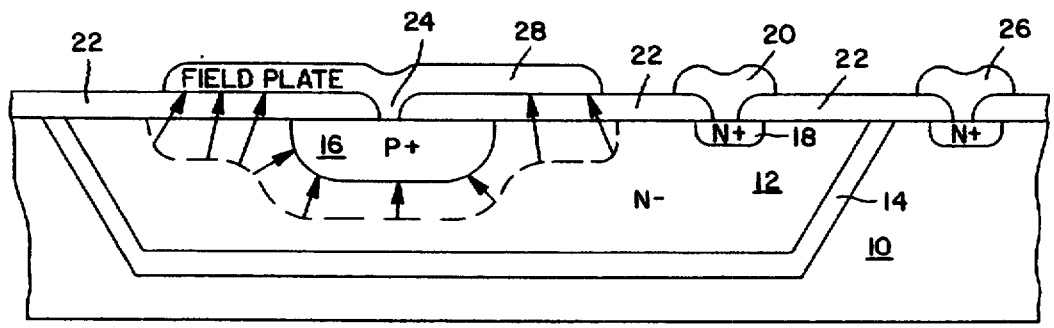
FIG. 1 is an elevation in cross-section of an IC with a PN junction illustrating the extent of the field resulting from the use of a field plate alone.

The IC illustrated in FIG. 1 includes a conventional conductive substrate 10 (e.g., polysilicon) isolated from an N-semiconductor island 12 by a insulating layer 14 (e.g., oxide). A P+ conductivity type well 16 is formed in the surface of the island 12 forming a PN junction. A small N+ well 18 spaced from the well 16 may also be formed in the surface of the island 12 as the surface contact area for the island terminal 20. As a typical example, the depth of the island 12 therein may be in the range 5 to 100 microns, with the depth of the well 16 in the range 1 to 25 microns and desirably at least five microns from the insulation of the substrate.

A suitable dielectric layer 22 (e.g., oxide) is formed on the surface of the island. Thereafter, a cathode terminal 20 is connected to the island contact area 18, an anode conductor 24 is connected to the P well 16 and a substrate contact 26 may be formed through the insulator 22 in a conventional manner. A field plate 28 is formed at least over almost all of the surface PN junction and extends laterally in all directions therefrom.

To reduce the series resistance of the PN junction, the doping concentration of the island and the well is kept within two orders of magnitude of each other, e.g., in the range of $1 \times 10^{13}$ to $3 \times 10^{15}$ atoms per cubic centimeter for the island 12 and in the range of $5 \times 10^{14}$ to $3 \times 10^{17}$ atoms per cubic centimeter for the P well 16. If this is not a design requirement of the IC, the doping of the well and island need not be so constrained. It should be noted that a doping concentration well in excess of $1 \times 10^{14}$ atoms per cubic centimeter for the island has the effect of increasing the maximum temperature of operation of the PN junction.

FIG. 1 does not illustrate the existence of a field or the existence of a depletion layer as a result of the biasing of the substrate from the contact 26. For this no-field condition to exist, the potential of the substrate 10 (as established by the contact 26) must be approximately the potential of the island (as established by the island contact 20).

The use of the field plate 28 and the biasing of the substrate 10 allows for an increased impurity concentration in the island 12 as discussed above.

Figure 2:
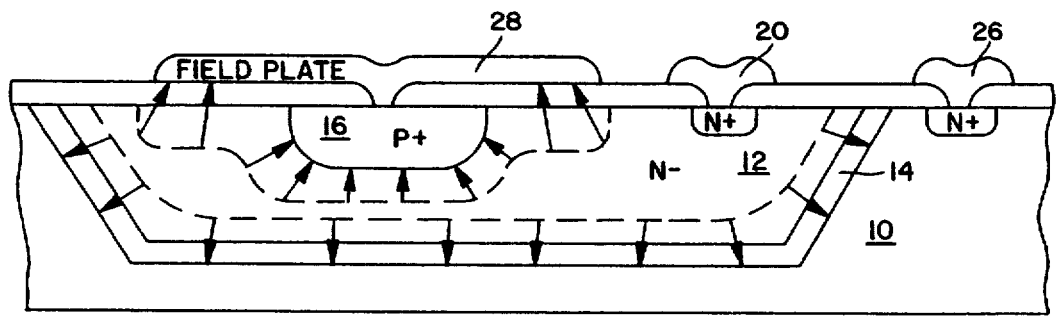
FIG. 2 is an elevation in cross-section of the IC of FIG. 1 illustrating the extent of an additional field resulting from the biasing of the substrate.

As shown in FIG. 2, the biasing of the substrate 10 may create a field with an accompanying depletion layer by creating a potential difference between the substrate 10 (as established by contact 26) and the island (as established by contact 20). While the fields do not meet in FIG. 2, they may be made to do so in the area under the PN junction by increasing the bias of the substrate as taught by Hartman, et al. supra. Merger of these fields under the PN junction will not necessarily improve the reverse bias breakdown because breakdown does not occur there.

Figure 3:
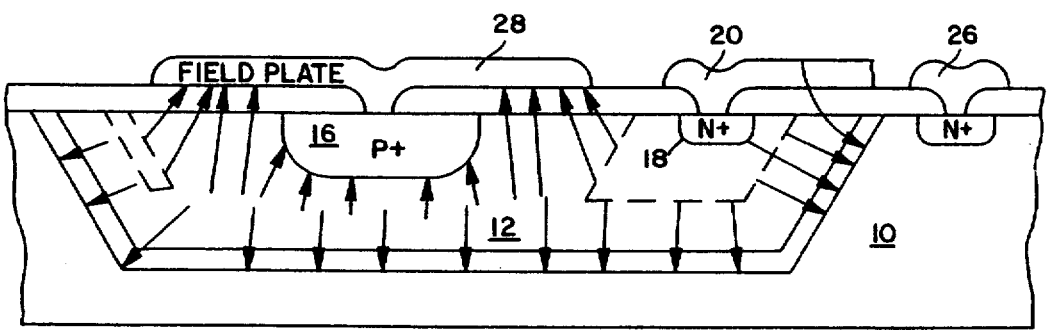
FIG. 3 is an elevation in cross-section of an IC of FIG. 1 illustrating the merging of the fields from the field plate and the substrate in the area under the field plate.

In FIG. 3, the bias of the substrate 10 has been additionally increased to merge the fields from the substrate 10 and field plate 28 without avalanche, and thus to totally deplete the region under the field plate. For an appropriately large field plate, the breakdown may exceed the breakdown of a plane PN junction with the same doping profile.

In order to completely deplete the island 12 between the field plate 28 and the substrate 10, the field plate 28 and the substrate 10 must be reversed biased with respect to the island 12. Typically, the field plate 28 and the substrate 10 are connected to the anode 24 by a conductor. As illustrated in FIG. 3, the field produced by the field plate 28 meets the field produced by the substrate 10 to form substantially vertical field lines. The biasing is selected such that the island 12 between the field plate 28 and the substrate 10 totally depletes before the critical field for avalanche is reached in that region. It should also be noted that the region under the anode 24 can also be completely depleted before the critical field for avalanche is reached.

The field plate and substrate are biased to voltages less than the island for N conductivity type islands, and preferably at the voltage of the well therein. As earlier indicated, the difference in the doping concentration at the PN junction should be within two orders of magnitude of each other to reduce the series resistance of the junction.

Where total depletion is obtained, the application of additional voltage across the PN junction will increase only slightly the horizontal component of the field in these regions. Further depletion is possibly only in the area of the island laterally beyond the outer edge of the field plate 28. The horizontal rate of change in the field under the field plate 28 will be slower than in a conventional structure because much of the charge in this region is utilized to establish the vertical field lines as described above. Since by application of Poisson's equation:

$$\frac{dE}{dx} + \frac{dE}{dy} = \frac{qNc}{\epsilon} \tag{1}$$

where E is the electric field;

where $\epsilon$ is the dielectric constant of the semiconductor; and where Nc is the cathode (N island) impurity concentration. Therefore, a laterally extending region of high field can be obtained which is broader than disclosed by Hartman et al, supra, for an IC with the same doping profile, with the voltage V from anode diffusion to cathode diffusion given by the equation:

$$V = \int -E_x dx \tag{2}$$

Since the horizontal component $E_x$ of the field E is relatively constant under the field plate 28, a higher breakdown may be obtained by increasing the length of the field plate 28 laterally well beyond the PN junction.

A common implementation of the biasing of the structure shown in FIG. 3 would be to integrate the field plate 28 with the anode 24, and to bias the substrate 10 by connecting the substrate to the anode 24. Alternatively, and desirably where a high voltage between the substrate 10 and cathode contact 20 may induce breakdown, the substrate 10 may be biased to a value intermediate that of the anode 24 and cathode 20 voltages. This bias may be established by a voltage divider between the anode and cathode, either as part of the IC in a separate island or on the surface of the island as thin film resistors.

In an IC having several diodes and transistors at different voltages, it may be desirable to bias the substrate at the most negative voltage on the IC, or at a voltage intermediate between the most negative and most positive voltages on the IC. The bias may be set, e.g., at one half the rated voltage for the junction, or at one-half the voltage across the junction and may be made to vary dynamically therewith. Alternatively, the bias of the trench may be varied along its length and chosen as a function of proximity to an island contact or interconnect.

Figure 4:
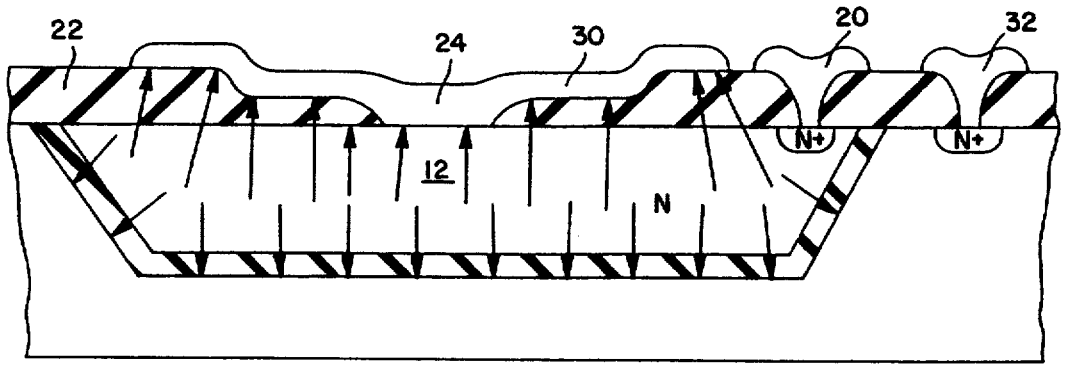
FIG. 4 is an elevation in cross-section of a second embodiment of an IC illustrating the merger of the fields from the field plate and substrate.

In addition to the junction diode illustrated in FIG. 3, the present invention is also applicable to Schottky barrier diodes as illustrated in FIG. 4. With reference to FIG. 4, the anode contact 24 is selected of an appropriate metal which forms at the island surface a Schottky barrier with the N type island 12. The field plate 30 may be an integral part of the anode contact and extend laterally therefrom. The insulating oxide 22 between the field plate 30 and the island 12 is desirably stepped so as to be the thinnest adjacent to the Schottky barrier region under the anode 24. As in FIG. 3, field plate contact and substrate contact 32 are reverse biased with respect to the cathode contact 20 so as to completely deplete the N type region 12.

Figure 5:
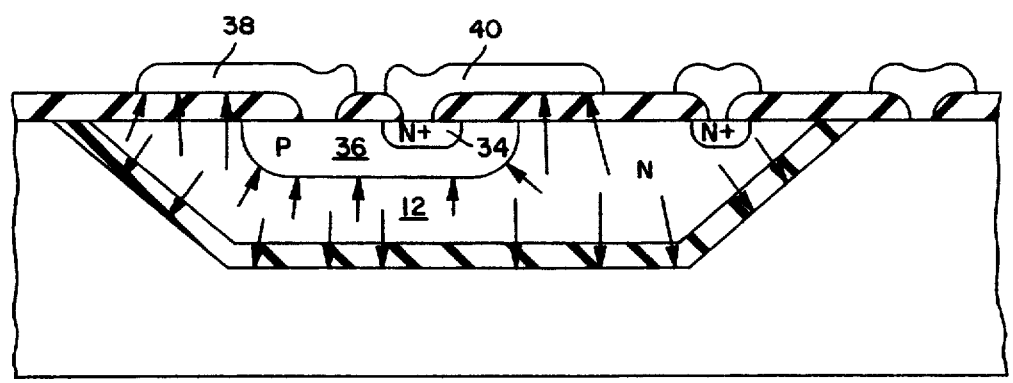
FIG. 5 is an elevation in cross-section of a third embodiment of an IC illustrating the merger of the fields from the field plate and substrate.

Another embodiment of the present invention is shown in FIG. 5 where a bipolar transistor is illustrated. With reference to FIG. 5, an N+ emitter region 34 is formed in the P well anode region 36 which forms the base of the transistor. A base metal contact 38 is provided for the base region 36 and an emitter contact 40 is made to the emitter region 34. The closely spaced emitter and base metalization 38 and 40, respectively, jointly act as a field plate for the base-collector junction and cover substantially all portions thereof as well as a substantial portion of the island 12 laterally beyond the surface junction.

With continued reference to FIG. 5, the collector-to-emitter breakdown is increased over that of a conventional structure of the same doping profile by the fact that the field under the base 36 and the emitter 40 is limited to a value less than the collector-emitter avalanche field by the total depletion of the N region 12 there. Further, it is increased by the screening effect afforded by the total depletion from the field plate and the substrate bias of the adjacent N collector region 12.

Where the geometry of the IC dictates that the field therefrom passes through the edge of the island between the island contact or its connector and the biased substrate, the field may cause avalanche in the corner and thus reduce the breakdown of the device. As shown for example in the upper right hand corner of FIG. 3, a field may exist between the substrate 10 and the island contact area 18 (the heavy straight arrow) and/or between the substrate 10 and the conductor 20 (the heavy curved arrow). Such fields may be additive to the field resulting from the potential difference between the substrate 10 and the island 12 generally, and because of the short distance, cause avalanche.

These fields may be reduced by reducing the bias of the substrate 10, but such reduction in the areas under the field plate 28 will defeat the merging of the fields. In one aspect of the present invention, the bias of the vertical and lateral isolation of the island may be made independent so that (a) the fields can be made to merge under the field plate 28 while (b) the potential difference between the substrate (10) and the island contact 20 or its connector is kept small.

Figure 6:
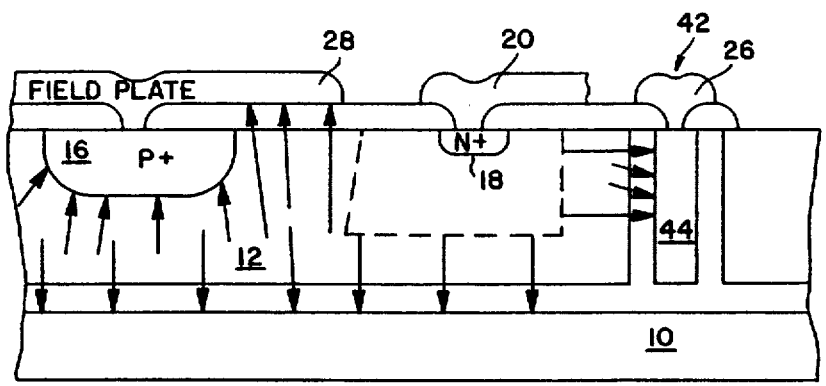
FIG. 6 is an elevation in cross-section of a fourth embodiment of an IC in which the vertical and lateral isolation of the island has been electrically separated for independent biasing.

One embodiment of an IC with an independent vertical and lateral bias is illustrated in FIG. 6. With reference to FIG. 6 where like elements have been accorded like numerical designations, lateral isolation is provided by a trench 42 filled with a conductive substance 44 such as polysilicon. Where the vertical and lateral substrate bias voltages are independent, the lateral bias voltage as applied to contact 26 may be made to approximate the potential of the island contact 20 or its connector thereby minimizing the field therebetween and reducing corner breakdown.

Figure 7:
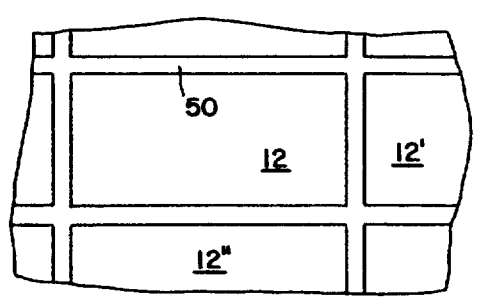
FIG. 7 is a plan view of a portion of an IC showing electrically connected lateral trenches.
Figure 8:
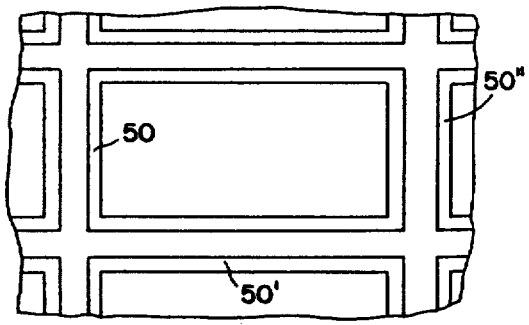
FIG. 8 is a plan view showing a portion of an IC with electrically isolated trenches.

As shown in FIG. 7, the trench 50 may be equipotential all of the way around the island 12. If so, the trenches of adjacent islands 12', 12" etc., may be integrated to save space on the IC. However, as shown in FIG. 8, it may be desirable to separate the trenches 50, 50', 50", etc. so that they may be differently biased as a function of (a) the devices contained within the respective islands isolated thereby and/or (b) the potentials at which such devices are operated.

It may also be desirable to isolate different portions of the trench along its length so that critical areas such as the areas of a trench under the island interconnects or immediately adjacent the island contacts may be biased differently as needed.

Although the present invention has been described using as illustrative embodiments, particular conductivity type islands and wells, it is to be understood that the present invention is also applicable to ICs using the opposite conductivity type. As is known in the art, the island insulation may be tapered in thickness, and the doping concentration may have a gradient.

The depth of the island which is totally depleted may be greater than the depth which can be depleted by the bias on the field plate alone, thus increasing the design flexibility for the depth and impurity concentration of the island.

As discussed above, the biasing of the field plate and substrate totally deplete the island between them and increases breakdown for a given doping profile. This means that increased doping concentrations may be used for the same breakdown, thereby increasing the maximum operating temperature.

Where the geometry of the IC dictates the location of contacts or conductors adjacent the lateral edge of the island, the separate biasing of vertical and lateral substrates provide greater design flexibility, as does biasing the lateral isolation differently along its length.

While preferred embodiments of the present invention have been described, it is to be understood that the embodiments described are illustrative only and the scope of the invention is to be defined solely by the appended claims when accorded a full range of equivalence, many variations and modifications naturally occurring to those skilled in the art from a perusal hereof.

What is claimed is:

1. A method of increasing the breakdown voltage of a semiconductor island having at least one of a PN and Schottky junction and an island contact adjacent a conductive material filled trench with the conductive material electrically isolated from the island contact comprising the step of:
   (a) biasing the conductive material to reduce the difference in potential between the conductive material and the island contact, thereby decreasing the field strength in the island between the conductive material and the island contact.

2. The method of claim 1 including the step of biasing a substrate beneath the junction.

3. The method of claim 2 wherein the bias of the substrate is different from the bias of the conductive material.

4. The method of claim 1 wherein the bias is approximately one-half of the rated voltage of the junction.

5. The method of claim 1 wherein the bias is variable.

6. The method of claim 5 wherein the bias is dynamically related to the voltage across the junction.

7. The method of claim 6 wherein the bias is approximately one-half of the voltage across the junction.

8. The method of claim 1 wherein the bias differs for different areas along the length of the trench.

9. The method of claim 8 wherein the bias of different areas of the trench is related to proximity to the island contact.

10. The method of claim 8 wherein the island contact is electrically connected to a conductor which crosses a lateral edge of the island; and
   wherein the bias of different areas of the trench is related to proximity to the conductor where it crosses the edge of the island.

11. The method of claim 8 wherein the island includes two spaced lateral edge regions each crossed by a conductor; and
   wherein the bias on the conductive material is different for the areas adjacent the two regions.

12. The method of claim 11 wherein the bias of the two regions is related to the voltage of the conductor crossing it.

13. The method of claim 1 wherein the island is one of a plurality of islands on a common substrate with each island laterally isolated by a conductive material filled trench; and
   wherein the conductive material of the trenches is electrically interconnected and biased to the same potential.

14. The method of claim 1 wherein the island is one of a plurality of islands on a common substrate with each island laterally isolated by a conductive material filled trench;
   wherein the conductive material of at least one trench is electrically isolated from the conductive material of the other of the plurality of trenches; and
   including the step of biasing the conductive material of said at least one trench independently of the bias of the other of the plurality of trenches.

15. A method of increasing the breakdown voltage of a semiconductor island having at least one of a PN and Schottky junction and an insulated conductor crossing and electrically isolated from an island isolating trench defining a Lateral edge of the island comprising the steps of:
   (a) filling the lateral trench with a conductive material; and
   (b) biasing the conductive material to reduce the difference in potential between the conductive material and the conductor, thereby decreasing the field strength in the island between the conductor and the conductive material.

16. A method increasing the packing density of trench isolated islands each having at least one of a PN and Schottky junction and an island contact comprising the steps of:
   (a) biasing the conductive fill in the trench to reduce the potential difference between the trench and the island contacts; and
   (b) spacing the trench from the island contact a distance related to the potential difference.

17. A method of increasing the breakdown voltage of a semiconductor device having a substrate supported semiconductor island laterally defined by a conductive material filled trench, in which the island includes a field plate, a reverse biased PN junction and a surface contact spaced therefrom, and in which the device includes at least one conductor electrically connected to said island and crossing said trench, comprising the steps of:
   a. biasing the field plate;
   b. biasing the substrate sufficiently to establish with the bias of the field plate a substantially vertical field in the island beneath the field plate at a field strength less than critical for avalanche; and
   c. biasing the conductive material in the trench to reduce corner breakdown.

18. A method of increasing the breakdown voltage of a semiconductor device having a substrate supported semiconductor island laterally defined by a conductive material filled trench, in which the island includes a field plate, a reverse biased PN junction and a surface contact spaced therefrom, and in which the device includes at least one conductor electrically connected to said island and crossing said trench, comprising the steps of:
   a. biasing the field plate to partially deplete the region of the island beneath the field plate;
   b. biasing the substrate sufficiently to additionally deplete the region in the island beneath the field plate; and
   c. biasing the conductive material in the trench to reduce corner breakdown.

19. The method of claim 18 wherein the bias of the substrate is sufficient to totally deplete the region under the field plate without reaching the critical field for avalanche.

20. A method of enhancing breakdown voltage in an integrated circuit structure including a semiconductor island of a first conductivity type supported by a substrate isolated by an insulator, the island having a surface well therein of a second conductivity type forming a PN junction with a predetermined doping profile, the method comprising the steps of:
   a. applying a reverse bias voltage to the PN junction;
   b. providing an insulated field plate overlying substantially the entirety of the PN junction at the surface of the island and extending laterally beyond the surface PN junction over the region of the island immediately contiguous thereto;
   c. biasing the field plate sufficiently to form a first depletion layer in the island extending downwardly from the field plate over the entire surface area overlain by the field plate a distance less than the depth of the island;
   d. biasing the substrate supporting the island sufficiently to form a second depletion layer in the island extending upwardly from the insulator over the entire area beneath the surface area overlain by the field plate a distance less than the thickness of the island but sufficient to merge with the first depletion area to thereby totally deplete the entirety of the region in the island beneath the field plate at less than the critical field strength for avalanche in the region, the lateral extent of the field plate beyond the surface PN junction being such that the lateral component of the field in the island and under the field plate necessary to support the total bias does not cause the vector field to exceed the critical field.

21. The method of claim 20 wherein the integrated circuit structure includes a conductive material filled trench; and including the step of biasing the conductive material in the trench to reduce corner breakdown.

22. The method of claim 20 wherein the difference in doping concentration between the island and the well is within two orders of magnitude.

23. The method of claim 20 wherein the island bias is not less than the bias of the field plate and the substrate.

24. The method of claim 20 wherein breakdown for the PN junction is greater than the plane breakdown of a PN junction having the same doping profile.

25. The method of claim 20 wherein breakdown for the PN junction is greater than the breakdown of the same PN junction when the substrate is biased at the island bias voltage.

26. An integrated circuit comprising:
a substrate supported semiconductor island laterally defined by a conductive material filled trench electrically isolated from said substrate, said island having a PN junction and a surface contact spaced therefrom;
a least one conductor electrically connected to said island and crossing said trench;
means for biasing said substrate to increase the depletion of the area of said island under said PN junction; and
means independent of the bias of said substrate for biasing the conductive material in said trench to reduce corner breakdown.

27. The device of claim 26 wherein the planar breakdown value of said PN junction is greater than the plane breakdown value of a PN junction with the same doping profile.

28. The device of claim 26 including a field plate.

29. The device of claim 26 without a field plate wherein the depletion in the area beneath said junction is total.

30. The device of claim 26 without any buried layer beneath said junction.

31. An integrated circuit comprising:
a semiconductor island of a first conductivity type vertically isolated by a first insulated conductive substrate and laterally isolated by a second insulated conductive substrate, said substrates being electrically isolated from each other;
a well of a second conductivity type in said island forming a PN junction;
an island contact spaced from said well;
a least one conductor electrically connected to said island and crossing a lateral edge of said island;
first biasing means for biasing said first substrate to increase the depletion of the area of said island under said PN junction; and
second biasing means for biasing the said second substrate to a value independent of the bias of said first substrate.

32. The IC of claim 31 including a field plate extending laterally from the surface PN junction over a substantial portion of said island contiguous thereto;

wherein the thickness of said island is between about 5 and about 100 microns;
wherein the depth of said well is between about 1 and 25 microns;
wherein the bottom of said well is spaced at least 4 microns from said first insulated substrate;
wherein the doping concentration of said island and said well are within two orders of magnitude of each other; and
wherein the bias of said first substrate approximates the potential across said PN junction.

33. The IC of claim 31 wherein said the bias of said first substrate varies dynamically with the potential across said PN junction.

34. The IC of claim 31 wherein the bias of said first substrate is sufficient to totally deplete the area of said island under said PN junction.

35. The IC of claim 31 including a field plate connected to said well of a second conductivity type; and
wherein the bias of said first substrate is sufficient to totally deplete the area of said island under said field plate, 36. The IC of claim 31 wherein the bias of said second substrate is approximately the potential of said island.

37. An integrated circuit with enhanced breakdown voltage comprising:
a semiconductor island of a first conductivity type supported by an insulated substrate, the island having a surface well therein of a second conductivity type forming a PN junction with a predetermined doping profile;
an insulated field plate overlying substantially the entirety of the surface PN junction and extending laterally beyond the surface PN junction over the region of the island immediately contiguous thereto;
means for biasing the field plate sufficiently to form a first depletion layer in the island extending downwardly from the field plate over the entire surface area overlain by the field plate a distance less than the depth of the island;
means for biasing the substrate supporting the island sufficiently to form a second depletion layer in the island extending upwardly from the insulator over the entire area beneath the surface area overlain by the field plate a distance less than the thickness of the island but sufficient to merge with the first depletion area to thereby totally deplete the entirety of the region in the island beneath the field plate at less than the critical field strength for avalanche in the region,
the lateral extent of the field plate beyond the surface PN junction being such that the lateral component of the field necessary to support the total bias does not cause the vector field to exceed the critical field.

38. The IC of claim 37 wherein breakdown for said PN junction is greater than the plane breakdown of a PN junction having the same doping profile.

39. The IC of claim 37 wherein breakdown for the PN junction is greater than the breakdown of the same PN junction when the substrate is biased at the island bias voltage.

40. The IC of claim 37 wherein said insulated substrate includes electrically separated vertical and lateral isolating portions; and wherein said substrate biasing means includes means for separately biasing said vertical and lateral portions.

41. The IC of claim 40 wherein the bias of said lateral portion is approximately equal to the potential of said island; and wherein the bias of said vertical portion is approximately equal to the potential of said field plate.

42. The IC of claim 37 wherein said island has an impurity concentration greater than $1 \times 10^{14}$ atoms per cubic centimeter.

43. The IC of claim 37 wherein the impurity concentration of said island and said well are within two orders of magnitude of each other.

44. The IC of claim 37 wherein the thickness of said island is between about 5 and about 100 microns; and wherein the bottom of said well is spaced at least 5 microns from said first insulated substrate.

45. The IC of claim 37 wherein the bias of said plate and said substrate are not greater than the potential of said island.

46. An IC comprising:

a substrate supported semiconductor island laterally defined by a conductive material filled trench, said island having a PN junction and spaced surface contacts;

at least one conductor electrically connected to one of said contacts and crossing said trench;

means for biasing said substrate to increase the depletion of the area beneath said junction; and means independent of the bias of said substrate for biasing the conductive material in said trench to reduce corner breakdown.

47. The method of claim 17 wherein the biasing of the conductive material in the trench is independent of the biasing of the field plate and substrate.

48. The method of claim 18 wherein the biasing of the conductive material in the trench is independent of the biasing of the field plate and substrate.

* * * * *